US006847260B2

United States Patent
Gupta et al.

(10) Patent No.: US 6,847,260 B2
(45) Date of Patent: Jan. 25, 2005

(54) LOW DROPOUT MONOLITHIC LINEAR REGULATOR HAVING WIDE OPERATING LOAD RANGE

(75) Inventors: Vishal I. Gupta, Atlanta, GA (US); Prasun Raha, Richardson, TX (US); Gabriel A. Rincon-Mora, Atlanta, GA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/422,028

(22) Filed: Apr. 23, 2003

(65) Prior Publication Data

US 2004/0212429 A1 Oct. 28, 2004

(51) Int. Cl.$^7$ .............................. H03F 3/45; H03F 1/14
(52) U.S. Cl. ...................................... 330/257; 330/292
(58) Field of Search ................................. 330/257, 292

(56) References Cited

U.S. PATENT DOCUMENTS

| | | | | |
|---|---|---|---|---|
| 6,084,475 A | * | 7/2000 | Rincon-Mora | 330/255 |
| 6,304,131 B1 | * | 10/2001 | Huggins et al. | 327/538 |
| 6,518,737 B1 | * | 2/2003 | Stanescu et al. | 323/280 |
| 6,600,299 B2 | * | 7/2003 | Xi | 323/280 |

* cited by examiner

*Primary Examiner*—Patricia Nguyen
(74) *Attorney, Agent, or Firm*—Alan K. Stewart; W. James Brady, III; Frederick J. Telecky, Jr.

(57) ABSTRACT

A monolithic low dropout regulator includes an active capacitor multiplier that is used to form the dominant pole of the regulator, thereby yielding stability. This decouples the system stability from the high-frequency power supply rejection ratio (PSRR). The PSRR at high frequencies is tuned independently using a reasonable on-chip capacitor C2.

6 Claims, 1 Drawing Sheet

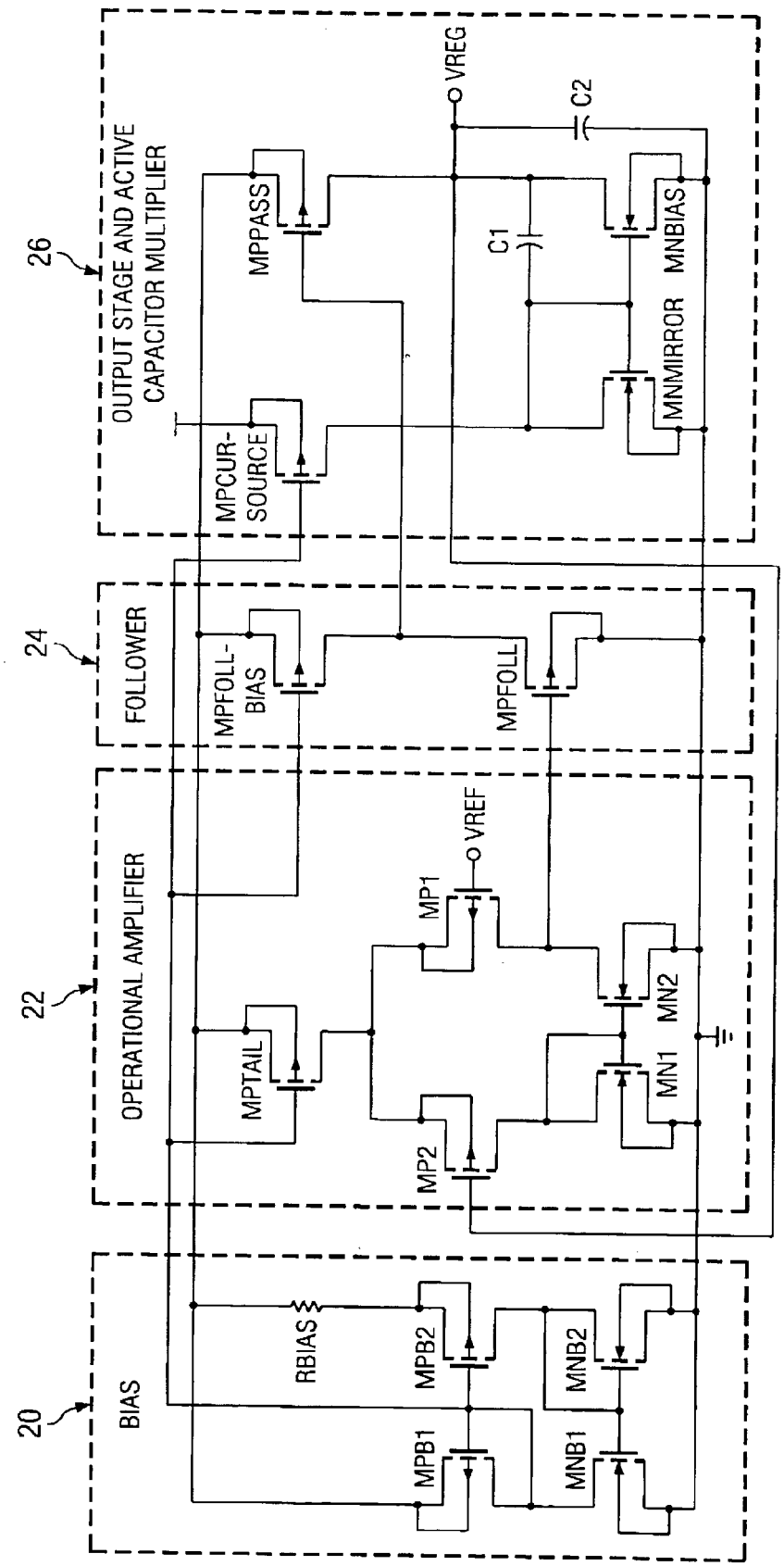

US 6,847,260 B2

LOW DROPOUT MONOLITHIC LINEAR REGULATOR HAVING WIDE OPERATING LOAD RANGE

FIELD OF THE INVENTION

This invention generally relates to electronic systems and in particular it relates to low dropout monolithic linear regulators.

BACKGROUND OF THE INVENTION

Linear regulators form an integral part of the power supply scheme for a phase locked loop (PLL). The regulator, while acting as a stable voltage source that supplies current, also shields the PLL from noisy supply fluctuations that can directly translate to jitter, leading to deterioration in its performance. Low supply voltages and tight jitter constraints necessitate the use of low dropout (LDO) regulator topologies that provide a high PSRR.

PLLs act as high pass filters, rejecting power supply noise only for frequencies less than the BW/10, where BW is the bandwidth. At higher frequencies, it is the function of the regulator to provide PSRR.

Most LDO topologies use a PMOS series pass device at the output. This increases the resistance of the output stage (over that of an output stage using an NMOS pass device) and necessitates the use of a large off-chip capacitor to compensate the circuit. This capacitor also provides a high power supply ripple rejection (PSRR) for the regulator. The value of this capacitor is often prohibitive for on-chip fabrication.

Any solution to compensate the circuit forming the dominant pole at the output of the amplifier (first stage), Miller compensation, for example, would yield a low PSRR at high frequencies since the load capacitor would have to be small to provide stability over operating conditions.

Prior art solutions for achieving a high power supply rejection ratio (PSRR) for a low dropout regulator (LDO) include: (1) using a large off-chip capacitor for compensation and high PSRR and (2) using nested miller compensated circuits. For the prior art solutions mentioned above, off-chip capacitors are not feasible for monolithic solutions. Further, the compensation of nested-miller-compensation circuits is complicated and they may not yield a good PSRR at high frequencies without off-chip capacitors.

SUMMARY OF THE INVENTION

A monolithic low dropout regulator includes an active capacitor multiplier that is used to form the dominant pole of the regulator, thereby yielding stability. This decouples the system stability from the high-frequency power supply rejection ratio (PSRR). The PSRR at high frequencies is tuned independently using a reasonable on-chip capacitor.

BRIEF DESCRIPTION OF THE DRAWINGS

In the drawings:

The Drawing is a circuit diagram of a low dropout monolithic linear regulator according to the present invention.

DETAILED DESCRIPTION OF PREFERRED EMBODIMENTS

The monolithic LDO regulator, according to the present invention, achieves high PSRR (for example |PSRR|>25 dB) over a large range of frequency (for example 1 Hz–1 GHz) and operating load conditions (load capacitor and load current) while utilizing minimal layout area.

An active capacitor multiplier is used to form the dominant pole of the regulator, thereby yielding stability. This decouples the system stability from the high-frequency PSRR. The PSRR at high frequencies can be tuned independently using a reasonable on-chip capacitor (for example 35–200 pF).

The requirements for stability and PSRR can be conflicting. In this approach, active capacitor multiplication is used to form the dominant pole at the output stage using a small on-chip capacitor. Another capacitor at the output provides a high PSRR at high frequencies. Thus, by decoupling the capacitors that determine the stability and the PSRR, a stable regulator using only on-chip capacitors and providing a high PSRR over a large bandwidth, is obtained.

FIG. 1 presents a schematic for a regulator according to the present invention. The compensation of the circuit is discussed below.

Bias circuit 20 includes transistors MPB1, MPB2, MNB1, and MNB2, and resistor RBIAS which form a constant-$g_m$ (constant transconductance) bias circuit. The bias circuit 20 sets up the bias for the operational amplifier 22 (opamp), the source follower 24 and the output stage 26. The bias circuit 20 provides the bias to transistors MPTAIL, MPCURSOURCE, MPFOLLBIAS.

Operational amplifier 22 includes transistors MN1, MN2, MP1, and MP2, along with the tail current device MPTAIL, which forms a PFET input differential amplifier. The dc gain ($A_{1-0}$) and the pole at the output ($p_1$) are given by $$A_{1-0} = \frac{g_{m-p1}}{g_{ds-p2} + g_{ds-n2}} \quad (1)$$

$$p_1 = -\frac{1}{(g_{ds-p2} + g_{ds-n2})C_{gs-pfoll}} \quad (2)$$

where $C_{gs-pfoll}$ is the gate-source capacitance of the follower device MPFOLL, $g_{m-p1}$ is the transconductance of transistor MP1, $g_{ds-p2}$ is the output conductance of transistor MP2, and $g_{ds-n2}$ is the output conductance of transistor MN2.

The follower circuit 24 includes transistors MPFOLL and MPFOLLBIAS. Follower circuit 24 isolates the high impedance node at the output of the opamp 22 from the high gate capacitance of the pass device MPPASS. The circuit 24 is a source follower, and the pole at the output is given by $$p_2 = \frac{g_{m-pfoll}}{C_{gs-ppass}} \quad (3)$$

where $g_{m-pfoll}$ is the transconductance of transistor MPFOLL and $C_{gs-ppass}$ is the gate-source capacitance of the pass device MPPASS.

The gate voltage of the output device in output stage 26 is regulated by the opamp 22 via the follower 24 through the feedback loop.

The output stage and active capacitor multiplier circuit 26 includes transistor MPPASS which forms the pass device for the output stage; transistors MPCURSOURCE, MNMIRROR, and MNBIAS; and capacitors C1 and C2. The dc gain, $A_{2-0}$, provided by output stage 26 is given by $$A_{2-0} = \frac{g_{m-ppass}}{g_{ds-ppass} + g_{ds-nbias}} \quad (4)$$

where $g_{m-ppass}$ is the transconductance of transistor MPPAS, $g_{ds-ppass}$ is the output conductance of transistor MPPASS, and $g_{ds-nbias}$ is the output conductance of transistor MNBIAS. Transistor MPCURSOURCE acts as a current source, supplying current to transistor MNMIRROR. Transistor MNBIAS, whose W/L ratio is much larger than transistor MNMIRROR's, provides active capacitor multiplication of capacitor C1. Capacitor C2 is connected from the output node VREG to ground. The equivalent capacitance of capacitor C1 is $$C_{eq} = \frac{C_1(1+k)}{\left(\frac{sC_1}{g_{m-nmirror}} + 1\right)} + C_2 \quad (5)$$

where k is the ratio of the W/L (width/length) ratio of transistor MNBIAS to transistor MNMIRROR (k>>1), and s is proportional to frequency. As can be seen from Equation (5), the effective capacitance at the output VREG at low frequencies is approximately $C_1(1+k)$. At high frequencies, the effective capacitance is dominated by capacitor $C_2$. The gain provided by the output stage is given by $$A_2 = \frac{-g_{m-ppass}r_o}{1 + sr_oC_{eq}} \approx \frac{-g_{m-ppass}r_o\left(\frac{sC_1}{g_{m-nmirror}} + 1\right)}{\{1 + r_os[C_1(1+k) + C_2]\}\left\{1 + s\frac{C_2}{g_{m-nmirror}(1+k)}\right\}} \quad (6)$$

where $$r_o = \frac{1}{g_{ds-ppass} + g_{ds-nbias}} \quad (7)$$

Hence the poles and zeros of this stage are given by $$p_3 = \frac{1}{r_o(1+k)C_2} \quad (8)$$

$$p_4 = \frac{g_{m-nmirror}(1+k)}{C_1} \quad (9)$$

$$z = \frac{g_{m-nmirror}}{C_2} \quad (10)$$

The "effective" capacitance of C1 and the output resistance of the output stage form the dominant pole, $p_3$. The other poles of the circuit are either cancelled through a zero, or designed to lie a decade beyond the gain-bandwidth product. Since the dominant pole, achieved through capacitive multiplication lies at a very low frequency, the output capacitor can have a relatively large value without causing instability and hence leading to a high PSRR over a large bandwidth. At high frequencies, capacitor C1 is essentially a "short", and the output impedance is effectively determined by the parallel combination of $1/g_{m-nbias}$ and the capacitor C2.

Capacitor C2 provides a high PSRR at high frequencies, while the dominant pole, which lies at a low frequency, is obtained through the active capacitance multiplication of C1.

This solution, according to the present invention, uses a simple compensation scheme to provide a regulator that has a high PSRR over a large frequency range using only on-chip capacitors, and is stable over a wide range of load conditions using a common compensation scheme.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:

a differential amplifier having a first input coupled to an output node;

an output pass device coupled to the output node and having a control node coupled to an output of the differential amplifier;

a bias transistor coupled to the output node;

a mirror transistor coupled to the control node of the bias transistor, wherein the bias transistor has a width-to-length ratio larger than the mirror transistor;

a current source transistor coupled to the mirror transistors; and a first capacitor coupled between the output node and the mirror transistor.

2. The circuit of claim 1 further comprising a follower circuit coupled between the differential amplifier and the output pass device.

3. The circuit of claim 1 further comprising a second capacitor coupled between the output pass device and a common node.

4. The circuit of claim 1 wherein the output pass device is a transistor.

5. The circuit of claim 1 wherein a second input of the differential amplifier is coupled to a reference voltage node.

6. The circuit of claim 1 further comprising a bias circuit coupled to the operational amplifier and to the current source transistor.

* * * * *